United States Patent
Kim

(10) Patent No.: US 7,713,816 B2
(45) Date of Patent: May 11, 2010

(54) SEMICONDUCTOR DEVICE AND METHOD FOR FABRICATING THE SAME

(75) Inventor: Mi Young Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 267 days.

(21) Appl. No.: 11/960,201

(22) Filed: Dec. 19, 2007

(65) Prior Publication Data
US 2008/0149979 A1 Jun. 26, 2008

(30) Foreign Application Priority Data
Dec. 20, 2006 (KR) .................. 10-2006-0131436

(51) Int. Cl.
*H01L 21/461* (2006.01)
(52) U.S. Cl. ............... 438/244; 438/430; 257/E21.019; 257/E21.546
(58) Field of Classification Search .......... 257/E21.019, 257/E21.546; 438/244, 396, 430
See application file for complete search history.

(56) References Cited

U.S. PATENT DOCUMENTS

| | | | | |
|---|---|---|---|---|
| 4,577,395 | A * | 3/1986 | Shibata ................ | 438/386 |
| 6,294,424 | B1 * | 9/2001 | Kang et al. ........... | 438/243 |
| 7,022,565 | B1 * | 4/2006 | Kao ..................... | 438/210 |
| 7,148,146 | B1 * | 12/2006 | Taravade et al. ...... | 438/692 |
| 7,416,937 | B2 * | 8/2008 | Koh .................... | 438/248 |
| 2002/0053691 | A1 * | 5/2002 | Leung et al. .......... | 257/296 |
| 2002/0094697 | A1 * | 7/2002 | Leung et al. .......... | 438/766 |
| 2003/0060017 | A1 * | 3/2003 | Okada ................. | 438/396 |
| 2007/0077703 | A1 * | 4/2007 | Lee ..................... | 438/244 |

FOREIGN PATENT DOCUMENTS

| CN | 101064282 A | 10/2007 |
|---|---|---|
| KR | 10-0179556 | 11/1998 |
| KR | 10-2000-0013978 | 3/2000 |

OTHER PUBLICATIONS

Office Action issued on Feb. 13, 2009, from the State Intellectual Property Office of the People's Republic of China in related Chinese Patent Application No. 200710195942X (2 pages).

* cited by examiner

*Primary Examiner*—Allan R. Wilson
(74) *Attorney, Agent, or Firm*—Finnegan, Henderson, Farabow, Garrett & Dunner, L.L.P.

(57) ABSTRACT

A method for fabricating a semiconductor device having a capacitor is provided. The method includes forming an isolation layer on a substrate on which a capacitor region and a transistor region are defined, forming a trench in the isolation layer, sequentially forming a first polysilicon layer, a dielectric layer, and a second polysilicon layer on an entire surface of the substrate including the trench, forming a capacitor in the trench by performing a chemical mechanical polishing process until an upper surface of the isolation layer is exposed, forming a first photoresist pattern to expose the transistor region, removing the second polysilicon layer and the dielectric layer using the first photoresist pattern as a mask, forming a second photoresist pattern in the transistor region, and forming a gate electrode by selectively removing the first polysilicon layer in the transistor region using the second photoresist pattern as a mask.

4 Claims, 3 Drawing Sheets

SEMICONDUCTOR DEVICE AND METHOD FOR FABRICATING THE SAME

RELATED APPLICATIONS

The present application claims the benefit of priority under 35 U.S.C. 119 to Korean Patent Application No. 10-2006-0131436, filed on Dec. 20, 2006, the entire contents of which are incorporated herewith by reference.

BACKGROUND

The present invention relates to a semiconductor device and a method for fabricating the same. More particularly, the present invention relates to a semiconductor device having a capacitor and a method for fabricating the same.

Recently, semiconductor technologies have been developed to combine a logic device with a memory device. The logic device, such as a central processing unit (CPU), may have information processing functions, while the memory device may be used to store the information before and/or after being processed. Further, in addition to the combination of the logic device and the memory device, an analog device and a radio frequency (RF) device may also be combined.

In an integrated circuit (IC), various semiconductor devices, such as a transistor, a capacitor, and a resistor, may be integrated onto a single chip. In addition, various methods for effectively fabricating the semiconductor devices have been developed. For example, an analog capacitor used in a logic circuit, such as a complementary metal-oxide-semiconductor (CMOS) logic circuit, may be formed to have a Polysilicon/Insulator/Polysilicon (PIP) structure or a Metal/Insulator/Metal (MIM) structure.

The analog capacitor having the PIP structure may prevent noise generated from the logic circuit and modulate the signals in the logic circuit. In addition, the analog capacitor may include a bottom electrode and a top electrode, both being fabricated by a polysilicon material, which is identical to the material constituting a gate electrode of a logic transistor of the logic circuit. Accordingly, the analog capacitor can be fabricated simultaneously with the gate electrode without additional processes.

FIG. 1 is a sectional view illustrating a semiconductor device including the analog capacitor having the PIP structure and the logic circuit according to the related art. In one embodiment, a region 'A' may represent a resistor region, a region 'B' may represent a capacitor region, and a region 'C' may represent a logic transistor region.

As shown in FIG. 1, an isolation layer 3, which may be used to define active regions, is formed on a semiconductor substrate 1. Semiconductor substrate 1 may comprise silicon.

A resistor 7 may be formed in region 'A' of semiconductor substrate 1. In addition, a bottom electrode 9, a dielectric layer 13, and a top electrode 15 may be formed in region 'B' of semiconductor substrate 1 to form the analog capacitor of the PIP structure. Further, a gate electrode 11, source/drain regions 10 formed in semiconductor substrate 1 adjacent to gate electrode 11, and a gate insulating layer 5 interposed between gate electrode 11 and source/drain regions 10 may be formed in region 'C,' thereby form a metal-oxide-semiconductor (MOS) transistor.

A first interlayer dielectric layer 17 is formed on semiconductor substrate 1 covering resistor 7, the analog capacitor, and the MOS transistor. Then, a second interlayer dielectric layer 19 is formed on first interlayer dielectric layer 17. In addition, contact plugs 21, 23, and 25 are formed in first interlayer dielectric layer 17 and second interlayer dielectric layer 19 to electrically contact top electrode 15 of the analog capacitor, and gate electrode 11 and source/drain regions 10 of the MOS transistor. In one embodiment, contact plugs 21, 23, and 25 may comprise metal.

In the semiconductor device having the above structure, the capacitance of the analog capacitor may be determined according to an area of dielectric layer 13 interposed between bottom electrode 9 and top electrode 15.

To form the analog capacitor, a photo process and an etching process may be performed on a first polysilicon layer, an oxide-nitride-oxide (ONO) layer, and a second polysilicon layer formed on semiconductor substrate 1. However, residues may remain after the performance of the photo process and the etching process. Thus, an over-etching process may be performed to remove the residues. At this time, the polysilicon layer formed in region 'C,' on which the photo process and the etching process are also performed, may have a thickness smaller than the target thickness of the polysilicon layer formed in region 'C' due to the over-etching process.

That is, the photo process and the etching process performed to the second polysilicon layer and the ONO layer may have a negative influence on subsequent etching processes performed to the first polysilicon layer.

Since an etch rate of the first polysilicon layer varies according to particular portions of the first polysilicon layer, on which an etching processing is performed, the problem occurred in the etching process performed to the second polysilicon layer may continue to occur in the etching process performed to the first polysilicon layer.

Meanwhile, the first polysilicon layer may be used to form a gate electrode of the CMOS transistor in other regions. Accordingly, to form the analog capacitor, the etching process may be performed more than once, such that the gate electrode may have a thickness smaller than its target thickness. Therefore, the electrical properties of the semiconductor device may be changed due to the reduced thickness of the gate electrode, thereby lowering the reliability of the semiconductor device.

SUMMARY

Embodiments consistent with the present invention provide a method for fabricating a semiconductor device. By minimizing the thickness difference of polysilicon layers, the semiconductor device may have improved reliability.

In one embodiment, the method includes forming an isolation layer on a semiconductor substrate on which a capacitor region and a transistor region are defined, forming a trench in the isolation layer, sequentially forming a first polysilicon layer, a dielectric layer, and a second polysilicon layer on an entire surface of the substrate including the trench, forming a capacitor in the trench by performing a chemical mechanical polishing (CMP) process, the CMP process being performed until an upper surface of the isolation layer is exposed, forming a first photoresist pattern to expose the transistor region, removing the second polysilicon layer and the dielectric layer using the first photoresist pattern as a mask, forming a second photoresist pattern in the transistor region, and forming a gate electrode by selectively removing the first polysilicon layer in the transistor region using the second photoresist pattern as a mask.

In another embodiment, the semiconductor device includes a semiconductor substrate on which a capacitor region and a transistor region are defined, an isolation layer formed on the substrate in the capacitor region, a trench formed in the isolation layer, a capacitor formed in the trench, the capacitor including a first polysilicon layer, a dielectric layer and a second polysilicon layer, and a gate electrode formed on the semiconductor substrate in the transistor region.

DETAILED DESCRIPTION

Hereinafter, a method for fabricating a semiconductor device having a capacitor, according to an embodiment consistent with the present invention, will be described in detail with reference to the accompanying drawings.

FIGS. 2A to 2E are sectional views illustrating a method for fabricating a semiconductor device including a capacitor having a polysilicon/insulator/polysilicon (PIP) structure, according to an embodiment consistent with the present invention.

Figure 1:
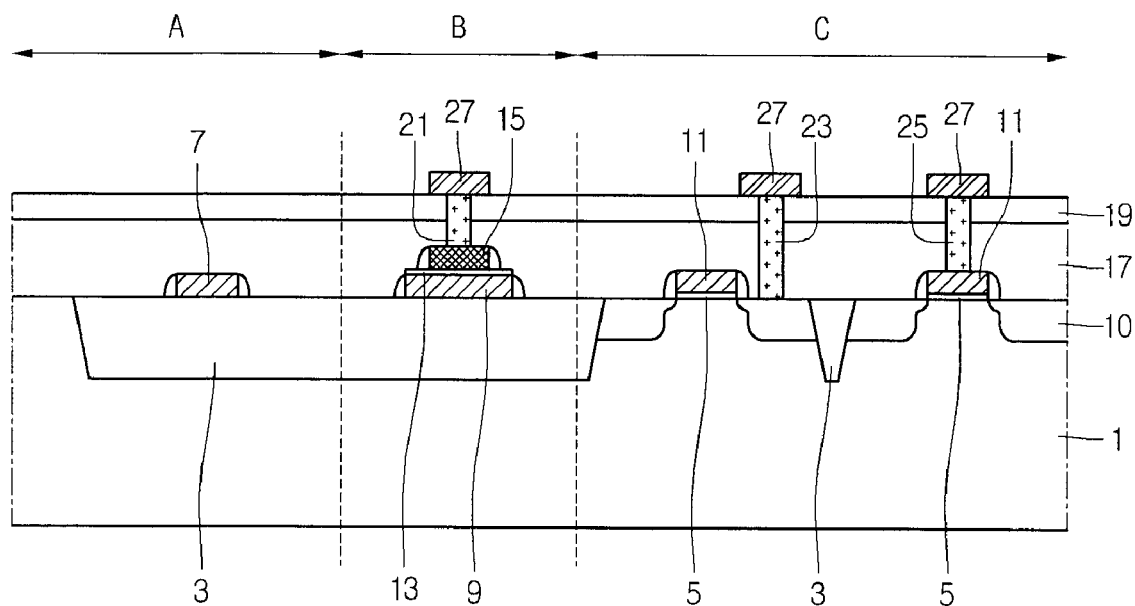
FIG. 1 is a sectional view illustrating a semiconductor device including a capacitor having a polysilicon/insulator/polysilicon (PIP) structure and a logic circuit.
Figure 2A:
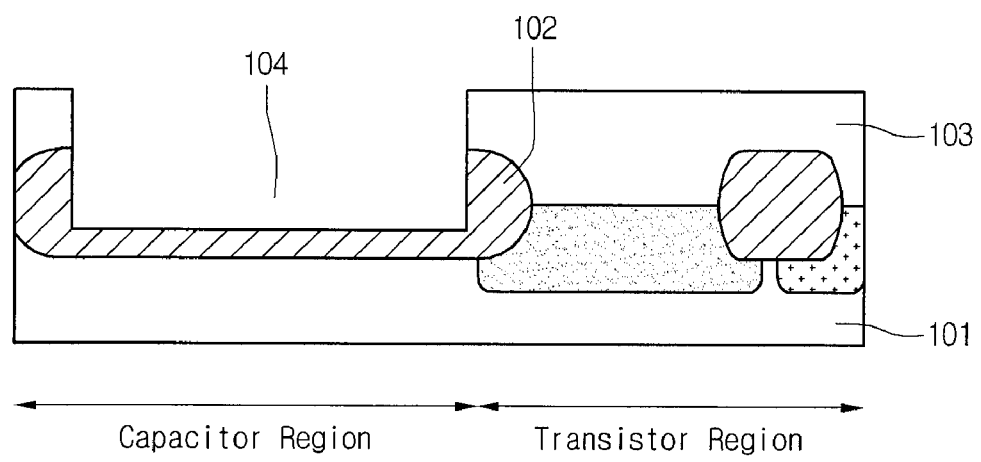
FIGS. 2A to 2E are sectional views illustrating a method for fabricating a semiconductor device having a capacitor, according to an embodiment consistent with the present invention.

Referring to FIG. 2A, an isolation layer 102 is formed on a predetermined region in a semiconductor substrate 101. Isolation layer 102 divides semiconductor substrate 101 into a transistor region and a capacitor region, and may isolate devices from each other.

At this time, isolation layer 102 may have a width sufficient for forming a capacitor of a polysilicon/insulator/polysilicon (PIP) structure thereon, and a thickness sufficient for taking the etching depth into consideration.

Subsequently, a first photoresist 103 is coated on an entire surface of semiconductor substrate 101 including isolation layer 102. And then, first photoresist 103 is selectively patterned in the capacitor region by an exposing process and a developing process. A portion of isolation layer 102 is selectively removed using patterned first photoresist 103 as a mask, so that a trench 104 having a predetermined depth is formed.

In certain cases, the depth of trench 104 may be the most important factor for determining heights of a top electrode and a bottom electrode of the capacitor to be formed later. That is, the depth of trench 104 is determined by taking the height of the top and bottom electrodes of the capacitor into consideration.

Figure 2B:
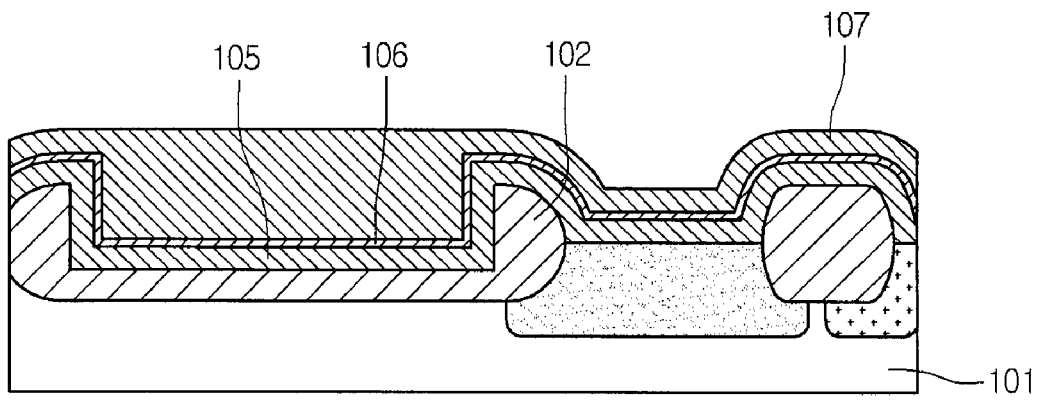

As shown in FIG. 2B, patterned first photoresist 103 is removed, and a first polysilicon layer 105 is formed on the entire surface of semiconductor substrate 101 including trench 104, so as to form the bottom electrode. In one embodiment, first polysilicon layer 105 may have a thickness less than that of isolation layer 102.

In certain cases, a gate insulating layer (not shown) may be formed on semiconductor substrate 101 in the transistor region, and first polysilicon layer 105 may be formed on the gate insulating layer.

Subsequently, an ONO layer 106 including an oxide layer, a nitride layer, and an oxide layer is formed on first polysilicon layer 105 to serve as a dielectric layer of the capacitor. A second polysilicon layer 107 for forming the top electrode of the capacitor is formed on ONO layer 106.

Although the dielectric layer comprises ONO layer 106, it is to be understood that the dielectric layer may comprise other dielectric materials, such as oxides of, for example, transition elements and rare earth elements, and ferroelectrics of, for example, $BaTiO_3$, $PbTiO_3$, and $SrTiO_3$.

Figure 2C:
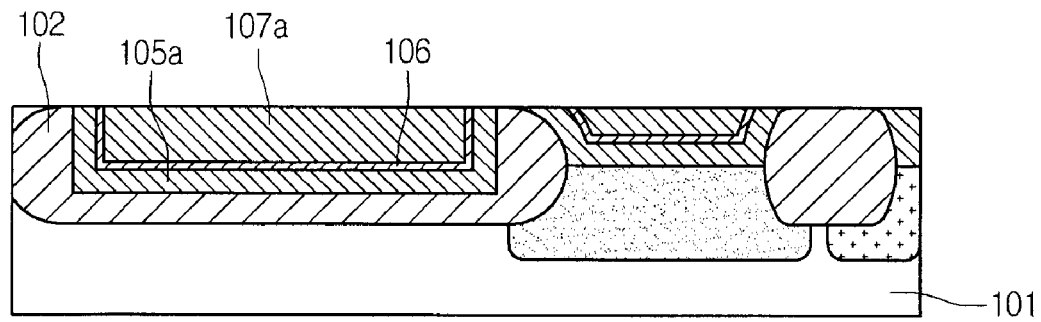

As shown in FIG. 2C, second polysilicon layer 107, ONO layer 106, and first polysilicon layer 105 are selectively polished by performing a chemical mechanical polishing (CMP) process until an upper surface of isolation layer 102 is exposed, so that the PIP capacitor having top electrode 107a, ONO layer 106, and bottom layer 105a is formed in trench 104.

Figure 2D:
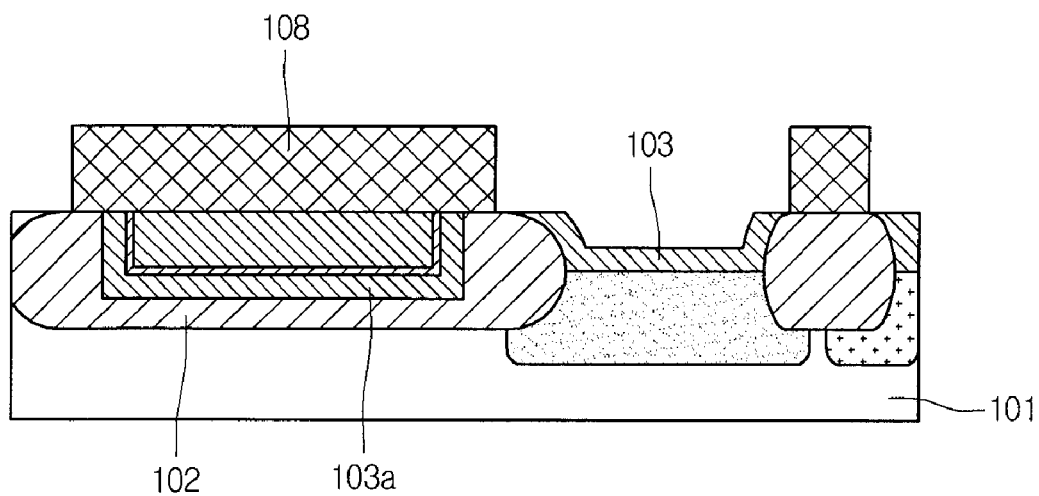

As shown in FIG. 2D, a second photoresist 108 is coated on the entire surface of semiconductor substrate 101. And then, second photoresist 108 is patterned by an exposing process and a developing process, thereby exposing the transistor region.

Subsequently, the exposed second polysilicon layer 107 and ONO layer 106 are removed using the patterned second photoresist 108 as a mask.

Figure 2E:
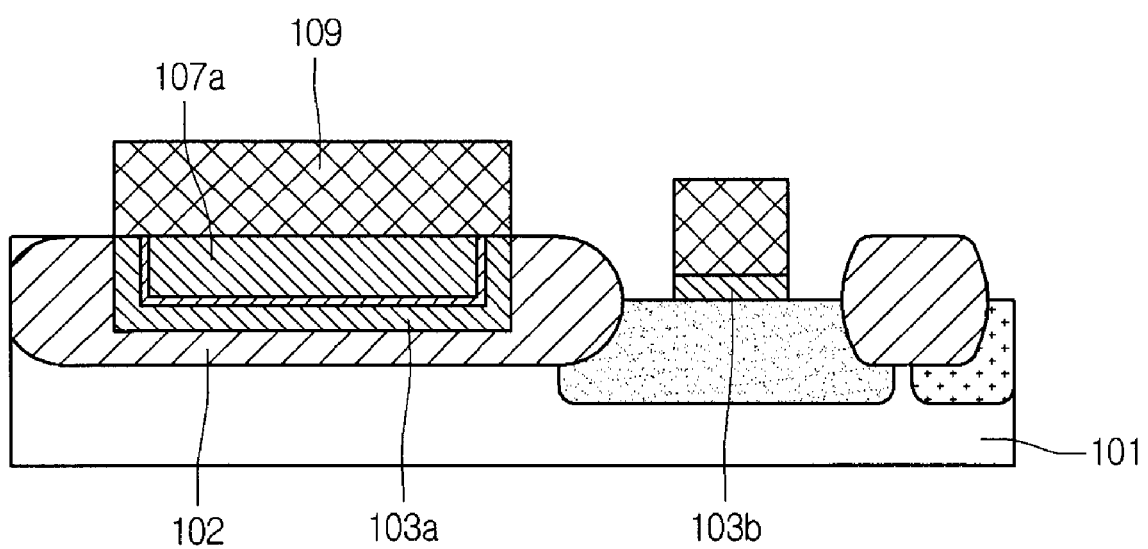

As shown in FIG. 2E, second photoresist 108 is removed, and a third photoresist 109 is coated on the entire surface of semiconductor substrate 101. And then, third photoresist 109 is patterned to define a gate region.

Subsequently, first polysilicon layer 105 is selectively removed using the patterned third photoresist 109 as a mask, so that a gate electrode 105b is formed.

Although not shown in the drawings, source/drain regions may be formed in the transistor region in subsequent processes. In addition, various metallization processes may be performed to form a transistor.

Through the above description, it will be apparent to those skilled in the art that various modifications and variations can be made consistent with the present invention. Thus, it is intended that such modifications and variations be considered within the scope of the appended claims.

What is claimed is:

1. A method for fabricating a semiconductor device, comprising:
   forming an isolation layer on a semiconductor substrate on which a capacitor region and a transistor region are defined;
   forming a trench in the isolation layer;
   sequentially forming a first polysilicon layer, a dielectric layer, and a second polysilicon layer on an entire surface of the substrate including the trench;
   forming a capacitor in the trench by performing a chemical mechanical polishing (CMP) process, the CMP process being performed until an upper surface of the isolation layer is exposed;
   forming a first photoresist pattern to expose the transistor region;
   removing the second polysilicon layer and the dielectric layer using the first photoresist pattern as a mask;
   forming a second photoresist pattern in the transistor region; and
   forming a gate electrode by selectively removing the first polysilicon layer in the transistor region using the second photoresist pattern as a mask.

2. The method as claimed in claim 1, further comprising forming source/drain impurity regions in the transistor region.

3. The method as claimed in claim 1, wherein the gate electrode has a thickness less than that of the isolation layer.

4. The method as claimed in claim 1, wherein the dielectric layer includes one selected from the group consisting of an oxide/nitride/oxide (ONO) layer, oxides of transition elements and rare earth elements, $BaTiO_3$, $PbTiO_3$, and $SrTiO_3$.

* * * * *